April 14, 1970 H. W. MAXWELL ET AL 3,506,879

CIRCUIT BOARD TERMINALS WITH LACED CONDUCTOR MEANS

Filed Sept. 12, 1968

INVENTORS
HUGH W. MAXWELL
MARIO VINCI
BY D. Gordon Angus
ATTORNEY

United States Patent Office 3,506,879
Patented Apr. 14, 1970

3,506,879

CIRCUIT BOARD TERMINALS WITH LACED CONDUCTOR MEANS

Hugh W. Maxwell, Alhambra, and Mario Vinci, Anaheim, Calif., assignors to Aerojet-General Corporation, El Monte, Calif., a corporation of Ohio Filed Sept. 12, 1968, Ser. No. 759,279
Int. Cl. H05k *1/04*
U.S. Cl. 317—101 8 Claims

ABSTRACT OF THE DISCLOSURE

This disclosure relates to circuit packaging, and particularly to terminal devices for connecting circuit elements togther in electrical circuit modules.

According to the present disclosure, a circuit module comprises a circuit board having a plurality of terminal devices mounted thereto. The terminal devices permit direct electrical contact between the lead wire of a circuit element and a conductor wire. This procedure minimizes the metal-to-metal interface between conductors and minimizes contact resistance between circuit elements.

This invention relates to circuit modules, and particularly to terminal devices for connecting circuit elements to electrical conductors to form circuit modules.

Heretofore, circuit elements mounted to circuit boards have often been connected together in electrical communication by means of conducive material fastened or bonded to the circuit board; the resulting modular assembly is often referred to as a "printed circuit." By way of example, copper traces were applied to the surface of the circuit board to provide electrical communication between selected circuit elements. One problem associated with printed circuit arrangements is that the circuit arrangement is substantially permanent and cannot be altered to construct new or different circuit designs. This problem could be solved with "bread-board" designs wherein terminal devices are mounted to circuit boards in spaced relation and circuit elements are connected to the terminals and are interconnected by removably fastenable conductors. However, prior bread-board arrangements were not capable of obtaining many of the advantages of printed circuits, particularly high density circuit packaging.

It is an object of the present invention to provide a modular electrical assembly having relatively high density element packaging.

Another object of the present invention is to provide a high density circuit board having circuit elements electrically interconnected by terminal devices, which devices permit versatility in circuit design and construction.

Another object of the present invention is to provide a modular electrical assembly having connector wires laced between selected terminal devices.

Another object of the present invention is to provide a modular electrical assembly wherein the connector wires are in direct physical contact with the lead wires of the circuit elements.

According to the present invention, a modular electrical assembly comprises a circuit board having terminal devices mounted thereto which provide connection to a lead of a circuit element and to electrical conductors.

According to one embodiment of the present invention, an aperture is formed through each terminal device, and another aperture is formed through the circuit board adjacent each terminal device. The leads of the circuit elements are attached to the terminal devices and the electrical conductors are laced through the apertures in such a manner that the conductors are predominantly disposed on one side of the circuit board, the conductors making electrical connection with the leads of the circuit elements at the terminal device.

According to an optional and desirable feature of the present invention, the terminal devices include a protrusion extending from one end thereof and a slot in the protrusion for receiving the lead wires of circuit elements.

According to another modification of the present invention, the terminal devices include means for contacting an electrical conductor on one side of the circuit board and means for holding the lead of a circuit element on the other side of the circuit board, the conductor holding the terminal device in place on the circuit board.

According to an optional and desirable feature of the present invention, the lead wires of the circuit elements are in direct physical contact with the electrical conductors.

The above and other features of this invention will be more fully understood from the following detailed description and the accompanying drawings, in which.

Figure 1:
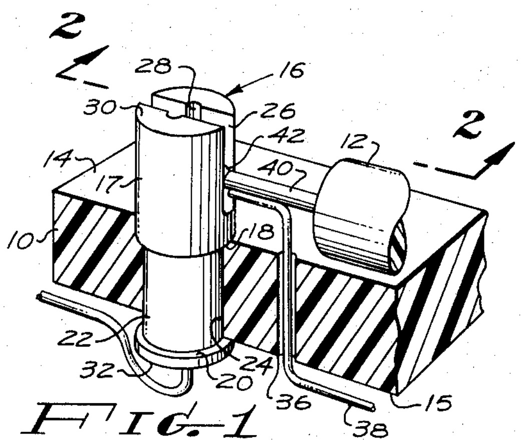
FIG. 1 is a perspective view, partly in cutaway crosssection of a circuit board arrangement having a terminal device mounted thereto according to the presently preferred embodiment of the present invention.
Figure 2:
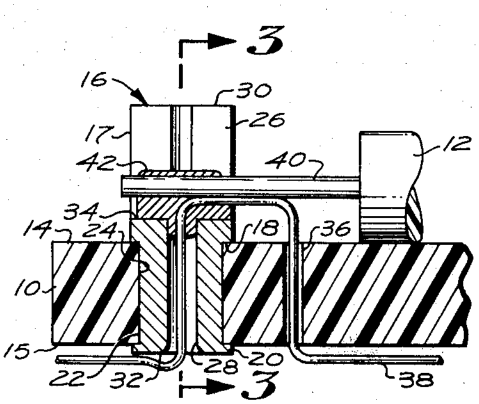
FIG. 2 is a section view of the circuit board arrangement illustrated in FIG. 1 taken at line 2—2 in FIG. 1.
Figure 3:
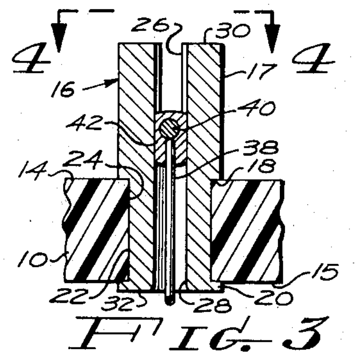
FIG. 3 is a section view of the circuit board arrangement illustrated in FIG. 1 taken at lines 3—3 in FIG. 2.
Figure 4:
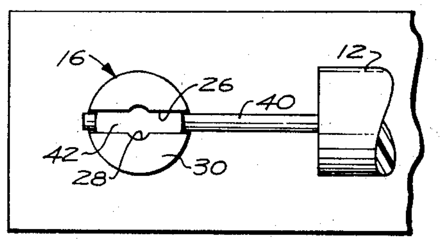
FIG. 4 is a top view elevation taken at line 4—4 in FIG. 3.

Referring to the drawings, there is illustrated a circuit board 10 having an electrical element 12 mounted to surface 14 thereof. Circuit board 10 is preferably constructed of a suitable electrically insulative material, and device 12 may be any electrical circuit element.

Terminal device 16 illustrated in FIGS. 1–4 is mounted to circuit board 10. Terminal device 16 preferably includes cylindrical shank portion 22 bounded by shoulders 18 and 20 at opposite ends thereof. Aperture 24 is formed through circuit board 10 between surfaces 14 and 15, and portion 22 is positioned in aperture 24 so that shoulders 18 and 20 bear against surfaces 14 and 15. Slot 26 is formed diametrically across the upper portion of protrusion 17 of terminal device 16 and extends between upper surface 30 and surface 34 above shoulder 18. Bore 28, which may have a larger diameter than the distance across slot 26, is formed between upper and lower surfaces 30 and 32, respectively, of terminal device 16. Bore 28 may form a groove on each side of slot 26 between surfaces 34 and 30.

Terminal device 16 is mounted to circuit board 10 in aperture 24. If circuit board 10 is resilient, the circuit board may be flexed to thereby enlarge apertures, and terminal device 16 may be pressed into position in aperture 24. Alternatively, shoulder 20 may be initially eliminated so that shank 22 is inserted into aperture 24. Shank 22 is thereafter deformed or crimped to form shoulder 20.

Aperture 36 is formed through circuit board 10 adjacent aperture 24, and conductor wire 38 is laced through aperture 36 and bore 28 of terminal device 16. Circuit element 12 is positioned on surface 14 of the circuit board and its lead wire 40 is positioned in slot 26 of the terminal device. Solder 42 or other electrical fastening means may be used to hold wires 38 and 40 together within terminal element 16. Preferably, wire 38 is an insulated wire capable of having the insulation burn therefrom during a heating process, such as when soldering or welding the wire to the terminal device. The surface tension of the solder and the ridges formed by bore 28 and slot 26 prevent solder 42 from being dislodged from terminal device 16, and thus assure proper electrical connection between conductor 38 and circuit element 12.

Figure 5:
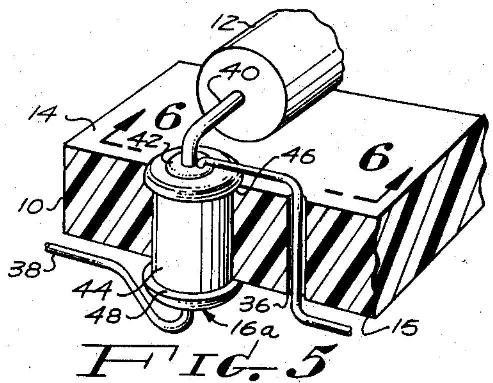
FIG. 5 is a perspective view, partly in cutaway crosssection, of a circuit board arrangement having a terminal device mounted thereto in accordance with a modification of the present invention.
Figure 6:
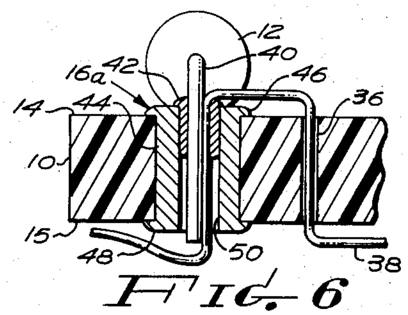
FIG. 6 is a section view of the circuit board arrangement illustrated in FIG. 5 taken at line 6—6 in FIG. 5.

FIGS. 5 and 6 illustrate a modification of a terminal device according to the present invention. In FIGS. 5 and 6 there is illustrated a terminal device **16*a* having a cylindrical shank 44 disposed between shoulders 46 and 48. Shoulders 46 and 48 are adapted to abut surfaces 14 and 15 of circuit board 10 as hereinbefore described in respect to the terminal device illustrated in FIGS. 1–4. Aperture 50 is provided through terminal device 16*a*, and aperture 36 is formed through circuit board 10 adjacent to terminal device 16*a***.

Terminal device **16*a* is mounted to circuit board 10 in the same manner as heretofore described in respect to terminal device 16 illustrated in FIGS. 1–4. Conductor 38 is laced through aperture 36 in circuit board 10 and through aperture 50 in terminal device 16*a*. Lead wire 40 of circuit element 12 is inserted in aperture 50, and the lead wire and conductor 38 are secured to terminal device 16*a* by means of solder 42** or other suitable electrical fastening means.

The embodiments illustrated in FIGS. 1–6 provide direct electrical contact between lead wire 40 of the circuit element and conductor wire 38 without reliance on the conduction of an intervening terminal device. This arrangement permits minimization of the metal-to-metal interface between conductors and minimizes contact resistance between the lead wires and conductor wires. Also, only one soldering operation is required for each terminal device.

Figure 7:
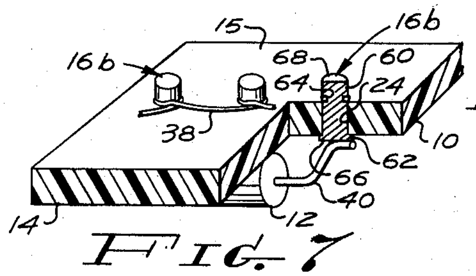
FIG. 7 is a perspective view, partly in cutaway crosssection of a circuit board arrangement having a terminal device mounted thereto in accordance with another modification of the present invention.

FIG. 7 illustrates another modification of a terminal device according to the present invention. In FIG. 7 there is illustrated a terminal device **16*b* having a shank 60 adapted to be passed through aperture 24 on the circuit board and a shoulder 62 adapted to abut surface 14, as hereinbefore described in respect to the terminal device illustrated in FIGS. 1–4. When terminal device 16*b* is in the position illustrated in FIG. 7, annular recess 64 in shank 60 is exposed above surface 15 of circuit board 10**.

Terminal devices **16*b* are press-fitted to the circuit board by pushing shank 60 of terminal device 16*b* through apertures 24 from surface 14 of circuit board 10 to expose recess 64. Conductor 38 is then looped about the exposed portion of terminal device 16*b* and within recess 64 to provide electrical connection between the conductor and the terminal device and to hold the terminal device from being dislodged from the circuit board. Circuit element 12 may be fastened or placed adjacent surface 14 of circuit board 10 and its lead 40 may be connected to surface 66 of the shoulder of terminal device 16. Preferably, terminal device 16*b* is constructed of nickel or other suitable material so that lead 40 may be welded to the terminal device. Also, conductor 38 may be welded or soldered to terminal device 16*b***.

Alternatively, circuit element 12 may be mounted adjacent surface 15 of circuit board 10 so that lead 40 is welded or soldered to surface 68 of the terminal device. This procedure permits direct connection between the wires.

Figure 8:
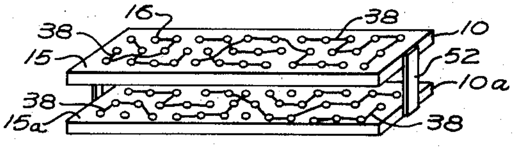
FIG. 8 is a perspective view of the underside of a plurality of circuit boards having terminal devices according to the present invention.

FIG. 8 illustrates a perspective bottom view of a plurality of circuit boards 10 and **10*a* illustrating the wired side of such circuit boards. Circuit elements (not shown) are mounted to the upper surfaces which are hidden from view in FIG. 8. The circuit elements may be mounted to the circuit boards in relatively high density relationship as heretofore known in printed circuit arrangements. The circuit elements are connected together by terminal devices 16 and conductors 38. As illustrated particularly in FIG. 8, conductors 38 are disposed predominantly on surfaces 15 and 15*a* of the circuit boards, while the circuit elements are disposed predominantly on the opposite side (not shown in FIG. 8) of the circuit board. Circuit boards 10 and 10*a* may be mounted together by means of suitable mounting brackets 52** and may be packaged in any desirable physical relation. By way of example, the circuit boards may be positioned in side-by-side relation, or may be stacked one above the other as illustrated in FIG. 8.

Conductors 38 preferably make electrical contact between circuit elements and terminal devices by lacing the wire between terminal devices to thereby minimize contact resistance between the circuit elements and the conducting wire and to eliminate bus-type connections previously used in printed circuit techniques. The conductor wire 38 utilized for the purposes of this invention is preferably an insulated wire having insulation capable of being burned off during a soldering or welding technique. Such wire is often referred to as "solder-through" wire, but it is to be understood that the conductor wire may be any type of wire. Where the wires are intended to cross over each other, as illustrated in FIG. 8, the wire should be insulated.

The present invention thus provides a circuit board arrangement wherein circuit elements may be mounted to a circuit board in high density relation and electrical conductors are provided for connecting the circuit elements together in a predetermined relation. The electrical connections may be altered if desired by techniques well known in the art. The circuit boards may be conveniently packaged into condensed modules and exhibit high strength capabilities so that they will not readily fail when subjected to abuse.

The terminal devices according to the present invention provide minimum resistance between circuit elements in a circuit module. The terminal devices provide a direct physical and electrical contact between the circuit elements and the conductor wire, thereby permitting a single metal-to-metal interface between wires to minimize contact resistance between circuit elements. Also, the wires may be attached to each terminal device in a single welding or soldering operation.

This invention is not to be limited by the embodiments shown in the drawings and described in the description.

What is claimed:

1. A modular electrical assembly comprising a circuit board having opposite sides; a plurality of terminal devices each having a shank mounted in a first aperture through said circuit board; a shoulder integral with said shank for abutment against a side of said circuit board; means on each of said terminal devices for connection to a lead wire of a circuit element; a second aperture through each of said terminal devices; a plurality of third apertures through said circuit board, each of said third apertures being located in close proximity to and associated with a respective second aperture; and an electrical conductor electrically connecting the terminal devices in predetermined relation, said conductor being located predominantly on one side of said circuit board and laced through predetermined third apertures to the said opposite said one side, and through the second apertures formed by the terminal devices associated with the selected third apertures to said one side, said conductor providing electrical communication between lead wires of circuit elements connected to predetermined terminal devices.

2. Apparatus according to claim 1 wherein each of said terminal devices comprises an electrically conductive, substantially cylindrical housing, a second shoulder integral with said housing and adjacent said shank, said one shoulder and said second shoulder abutting opposite sides of said circuit board, each of said second apertures being formed by a bore in said housing.

3. Apparatus according to claim 2 wherein said housing includes a protrusion extending from the side of said circuit board opposite said one side, and the means for connection to a lead wire of a circuit element comprises a slot in said protrusion.

4. Apparatus according to claim 3 wherein said lead wires and said conductor are in direct physical contact.

5. Apparatus according to claim 2 wherein said lead wires and said conductor are in direct physical contact.

6. Apparatus according to claim 1 wherein said lead wires and said conductor are in direct physical contact.

7. A modular electrical assembly comprising a circuit board having opposite sides; a plurality of terminal devices each having a shank mounted in a first aperture through said circuit board; a shoulder integral with said shank for abutment against one side of said circuit board; means on each of said terminal devices for connection to a lead wire of a circuit element; an annular recess on said shank adjacent the side of said circuit board opposite said one side; and an electrical conductor electrically connecting the terminal devices in a predetermined relation, said electrical conductor being connected to the terminal devices in said recess and adjacent said circuit board.

8. Apparatus according to claim 7 wherein said lead wires and said conductor are in direct physical contact.

References Cited

UNITED STATES PATENTS

| | | | |
|---|---|---|---|
| 2,420,754 | 5/1947 | MacFadden | 339—220 |
| 2,958,926 | 11/1960 | Morison. | |
| 2,974,258 | 3/1961 | Garthwaite. | |
| 3,093,887 | 6/1963 | Prestige et al. | |

ROBERT K. SCHAEFER, Primary Examiner

D. SMITH, Jr., Assistant Examiner

U.S. Cl. X.R.

339—17. 220